United States Patent
Panga et al.

(10) Patent No.: US 8,394,282 B2
(45) Date of Patent: Mar. 12, 2013

(54) ADAPTIVE NANOTOPOGRAPHY SCULPTING

(75) Inventors: Avinash Panga, Austin, TX (US); Sidlgata V. Sreenivasan, Austin, TX (US)

(73) Assignee: Board of Regents, The University of Texas System, Austin, TX (US)

(*) Notice: Subject to any disclaimer, the term of this patent is extended or adjusted under 35 U.S.C. 154(b) by 478 days.

(21) Appl. No.: 12/479,200

(22) Filed: Jun. 5, 2009

(65) Prior Publication Data

US 2010/0012622 A1 Jan. 21, 2010

Related U.S. Application Data

(60) Provisional application No. 61/060,007, filed on Jun. 9, 2008.

(51) Int. Cl.
*C23F 1/00* (2006.01)

(52) U.S. Cl. .......... 216/42; 216/44; 216/49; 216/38; 216/52; 438/759; 438/694; 438/697; 347/1; 347/54; 347/74; 347/14

(58) Field of Classification Search .......... 216/44, 216/41, 49, 38, 52; 438/694, 697, 759; 347/1, 347/54, 74, 14
See application file for complete search history.

(56) References Cited

U.S. PATENT DOCUMENTS

| | | | |
|---|---|---|---|
| 5,736,424 A * | 4/1998 | Prybyla et al. ............... 438/780 |
| 7,060,977 B1 | 6/2006 | Dupeyrat et al. |
| 7,360,851 B1 | 4/2008 | Snyder |
| 2003/0164949 A1 * | 9/2003 | Taylor et al. ............... 356/496 |
| 2004/0090478 A1 * | 5/2004 | Miller ........................... 347/14 |
| 2005/0270312 A1 * | 12/2005 | Lad et al. ........................ 347/1 |
| 2006/0035464 A1 * | 2/2006 | Sreenivasan ............... 438/690 |
| 2006/0063387 A1 | 3/2006 | Miller et al. |
| 2007/0015365 A1 * | 1/2007 | Chen et al. ................. 438/692 |
| 2007/0228593 A1 * | 10/2007 | Jones et al. ................. 264/40.4 |

FOREIGN PATENT DOCUMENTS

| | | |
|---|---|---|
| WO | 2005120834 A2 | 12/2005 |
| WO | 2008066562 A2 | 6/2008 |
| WO | 2009023074 | 2/2009 |

OTHER PUBLICATIONS

Hungarian Intellectual Property Office; Written Opinion for Singapore Patent Application No. 201008640-3, dated Feb. 8, 2012.
Written Opinion for Application No. 201008640-3, Intellectual Property Office of Singapore, 16 pages, Jan. 19, 2012.

* cited by examiner

*Primary Examiner* — Lan Vinh
*Assistant Examiner* — David Kaufman
(74) *Attorney, Agent, or Firm* — Cameron A. King

(57) ABSTRACT

Adaptive imprint planarization provides a surface having desired shape characteristics. Generally, topography of a first surface is mapped to provide a density map. The density map is evaluated to provide a drop pattern for dispensing polymerizable material on the first surface. The polymerizable material is solidified and etched to provide a second surface having the desired shape characteristics. Additionally, adaptive imprint planarization compensates for parasitic effects of the imprinting process.

20 Claims, 8 Drawing Sheets

ADAPTIVE NANOTOPOGRAPHY SCULPTING

CROSS REFERENCE TO RELATED APPLICATION

This application claims the benefit under 35 U.S.C. §119 (e)(1) of U.S. Provisional No. 61/060,007, filed Jun. 9, 2008, which is hereby incorporated by reference.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference.

An imprint lithography technique disclosed in each of the aforementioned U.S. patent publications and patent includes formation of a relief pattern in a formable layer (polymerizable) and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

Processing techniques using imprint lithography may rely on the presence of a substantially planar underlying substrate or substantially planar underlying layer(s). For example, reliability and ease of manufacturing during layer-by-layer semiconductor device manufacturing may rely on substantially planar substrate topography.

In the context of semiconductor manufacturing, the term planarization may be used to broadly describe two types of processes: topography improvement of a wafer surface after material deposition processes (e.g., planarization of an Inter-Layer Dielectric (ILD); or removal of deposited film to provide material in recessed regions (e.g., Shallow Trench Isolation (STI), Damascene processes, and the like).

Various planarization schemes have been developed include heat and reflow techniques, spin on glass (SOG) processes, and the like. The degree of planarity attainable by current schemes, however, may be limited. For example, one of the commonly used planarization techniques, chemical-mechanical fabrication (CMP) generally has a dependence on the material removal rate based on the pattern density of the material. Areas having high pattern density may have more contact area as compared to areas having a lower pattern density. This may result in more pressure being applied at the low pattern density areas leading to a higher material removal rate within the low-density areas. Low-density areas are planarized first, and then as material is removed at a constant rate, the high-density areas attain local planarization. This may lead to a step-like formation between the high-density and low-density areas and provide a long-range thickness variation within the planarized film. Preventive techniques, such as dummy fill and patterned resist, may be used to reduce the variation in pattern density, however, such techniques increase the complexity of the planarization process.

Contact planarization (CP), an alternative to CMP, provides for a substrate spin coated with a photo-curable material and pre-baked to remove residual solvent. An ultra-flat surface may be pressed on the spin-coated wafer forcing material to reflow and the pressure may be used to evenly spread out material for planarization. The quality of planarization, however, may be compromised by pattern density variation. Spin coating used for fluid distribution is generally expected to be uniform over a substrate. As such, regions with varying densities will generally have the same distribution of fluid. When the material is pressed with the ultra-flat surface, the material tends to flow from high feature density area to low feature density areas. The reflow may be limited due to the high viscosity of the material and/or mobility of the material due to the thin channel formed between the ultra-flat surface and the substrate. Additionally, fluidic forces between the ultra-flat surface and the substrate may cause tensile stress in the fluid film. This stress may be relieved when the ultra-flat surface is removed leading to deterioration in surface planarity.

Moreover, CP generally does not cater for large variations in feature density. For example, if there is a large area in a die with low pattern density, the material may not be able to reflow to fill in the void and thus may affect global planarity. Additionally, CP generally does not account for difference in surface topography of a substrate and/or the ultra-flat surface. For example, when the ultra-flat surface is pressed against the substrate, there may be variations in thickness of the material between them. Use of a very thick film of material may improve mobility of fluid, however, it may be difficult to transfer the same planarity to the substrate as non-uniformity of subsequent material removal processes (e.g., etching, polishing, etc.) may be dominant with thicker films.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
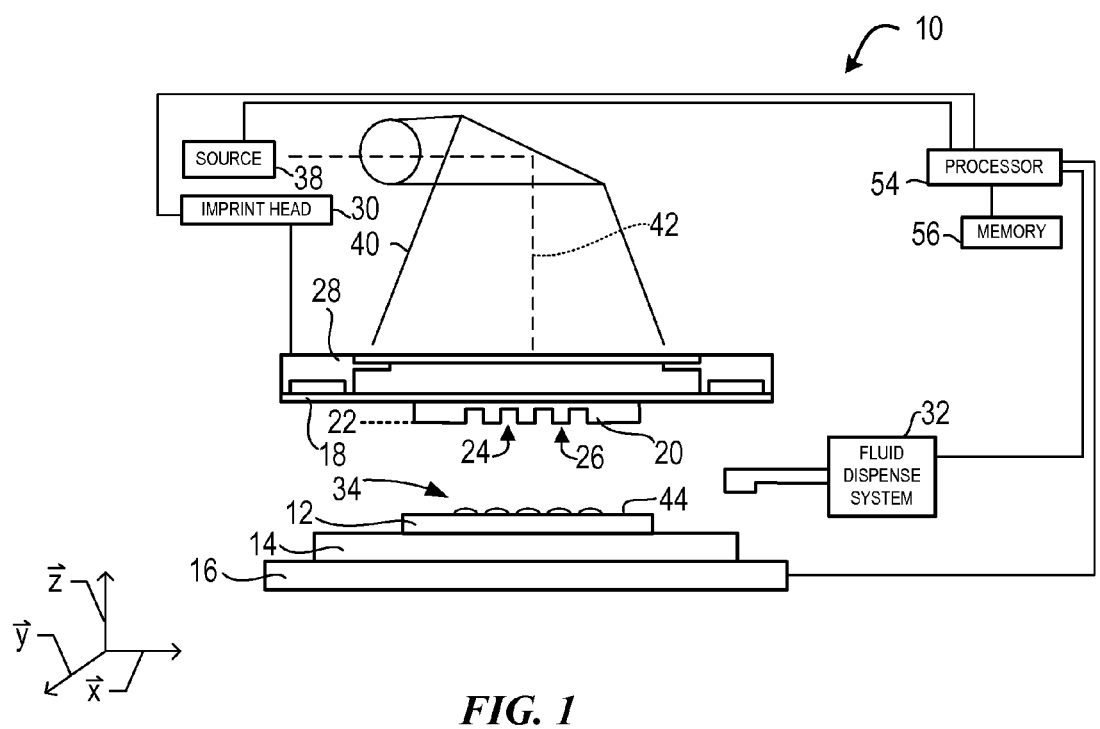
FIG. 1 illustrates a simplified side view of a lithographic system in accordance with an embodiment of the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is hereby incorporated by reference.

Substrate 12 and substrate chuck 14 may be further supported by stage 16. Stage 16 may provide motion along the x-, y-, and z-axes. Stage 16, substrate 12, and substrate chuck 14 may also be positioned on a base (not shown).

Spaced-apart from substrate 12 is a template 18. Template 18 may include a mesa 20 extending therefrom towards substrate 12, mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer mixture as described in U.S. Pat. No. 7,157,036 and U.S. Patent Publication No. 2005/0187339, all of which are hereby incorporated by reference.

Figure 2:
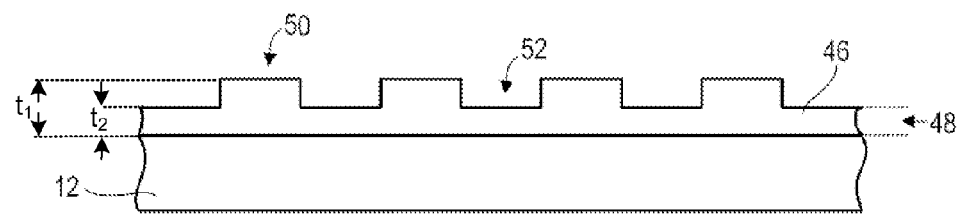
FIG. 2 illustrates a simplified side view of the substrate shown in FIG. 1 having a patterned layer positioned thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., broadband ultraviolet radiation, causing polymerizable material 34 to solidify and/or cross-link conforming to shape of a surface 44 of substrate 12 and patterning surface 22, defining a patterned layer 46 on substrate 12. Patterned layer 46 may comprise a residual layer 48 and a plurality of features shown as protrusions 50 and recessions 52, with protrusions 50 having thickness $t_1$ and residual layer having a thickness $t_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference.

Figure 3:
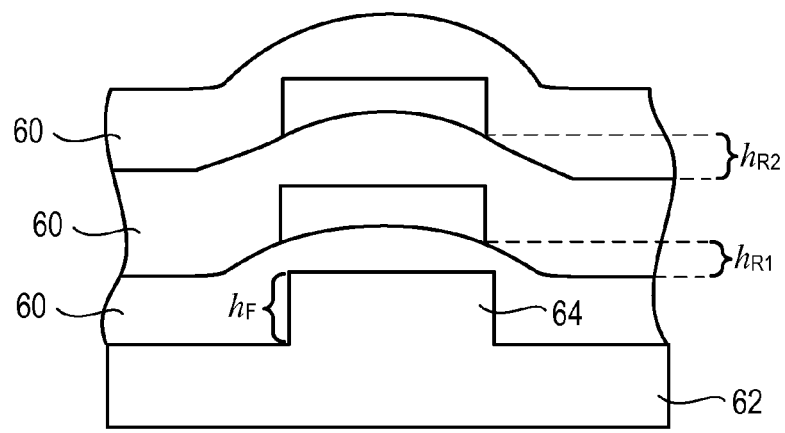
FIG. 3 illustrates a simplified side view of topography variations of multiple film layers due to an underlying substrate.

Referring to FIG. 3, material deposition processes generally provide film layers 60 of material that maintain the same topography as that of an underlying substrate 62. With increasing number of film layers 60, step height $h_F$ of a feature 64 may increase resultant step height $h_{R1}$ and then even further increase to resultant step height $h_{R2}$ as illustrated in FIG. 3. This increase may result in topography variations.

Large topography variations may hinder fabrication processes and/or cause reliability issues. In semiconductor processing, for example, to minimize large topography variations wafers are polished to improve surface planarity. Roughness, site front quadratic surface topography (SFQR), and global backplane indicated range (GBIR) are metrics used to quantify surface topography in low, medium and large spatial wavelengths. Typical 300 mm prime grade wafers used for manufacturing at 90 nm node have roughness of less than 1 nm, SFQR of around 90 nm, and GBIR of 2 microns. In comparison, a 75 mm prime grade wafer may have a roughness of less than 5 nm, SFQR of 1000 nm, and GBIR of 10 microns. However, to provide for the stringent planarity requirements, wafers may be subjected to several polishing steps which generally increase cost. Additionally, smaller sized wafers, as well as wafers of other material, generally are unable to meet the stringent planarity requirements and as such, are generally not viable for use to manufacture devices with sub micron features.

Figure 4A:
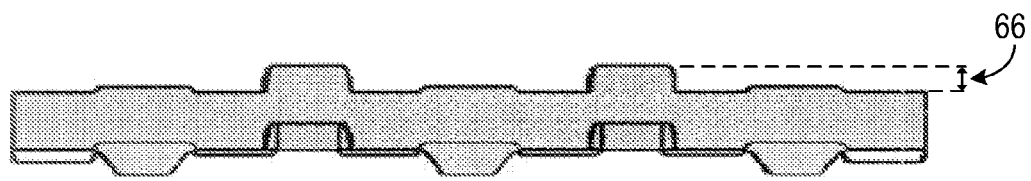
FIG. 4A and FIG. 4B illustrate simplified side views of local topography planarity deviations and global topography planarity deviations respectively.
Figure 4B:

FIG. 4A and FIG. 4B illustrate local topography planarity deviations 66 and global topography planarity deviations 68 such as those seen during semiconductor manufacturing. Local topography planarity deviations 66 may result as deposited material conforms to an underlying feature reflecting underlying surface variations. These deviations 66 may have the same order of magnitude (e.g., feature height) and/or may have low spatial wavelengths.

As illustrated in FIG. 4B, global topography planarity deviations 68 may be of larger magnitudes and have spatial wavelengths on the order of the size of a die. Global topography planarity deviations 68 may be observed over areas having significant change in the underlying pattern density. Although a patterning field having a 26×33 mm size may have the entire field exposed simultaneously for patterning, large topographical variation may exist due to surface topography of the entire wafer (e.g., thickness variations), as opposed to the targeted patterned area. This large topographical variation may be on the order of the diameter of the wafer.

Height variation of a surface may be categorized in three components when analyzed in spatial wavelength domain: nominal shape (height variation in the spatial wavelength >20 mm), nanotopography (height variation in the spatial wavelength between 0.2-20 mm), and surface roughness (height variation in the spatial wavelength <0.2 mm). Adaptive nanotopography sculpting, as described herein, may be used to alter nanotopography. Additionally, adaptive nanotopography sculpting, as described herein, may be used to alter roughness. For example, adaptive nanotopography sculpting may alter surface roughness of a substrate (e.g., bare silicon wafer), substrate having sub-micron features, and the like. It should be noted that adaptive nanotopography sculpting may be used to alter nanotopography and/or roughness without altering the nominal shape of the surface.

Referring to FIGS. 5A-5D, adaptive nanotopography sculpting may be used to nano-sculpt and adaptively minimize nanotopography deviations (e.g., local and/or global topography planarity deviations). Nano-sculpting may be initiated with a first surface 74, and by use of deposition and etch back to an appropriate depth, provide a second surface 76 with a desired surface topography (e.g., planar).

Figure 5A:
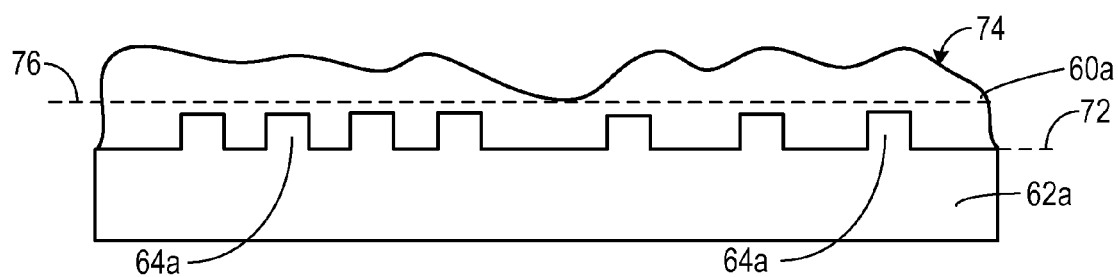
FIGS. 5A-5D illustrate simplified side views of formation of a surface having desired shape characteristics using adaptive nanotopography sculpting.
Figure 5B:
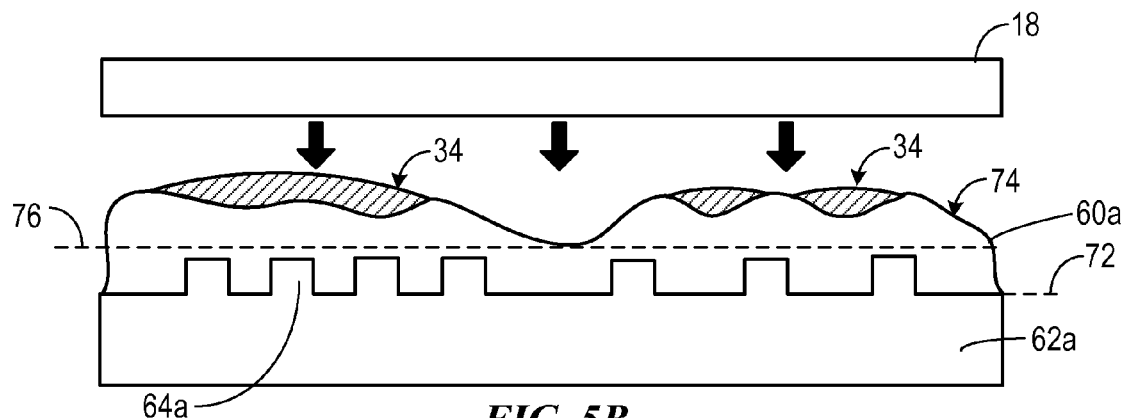
Figure 5C:
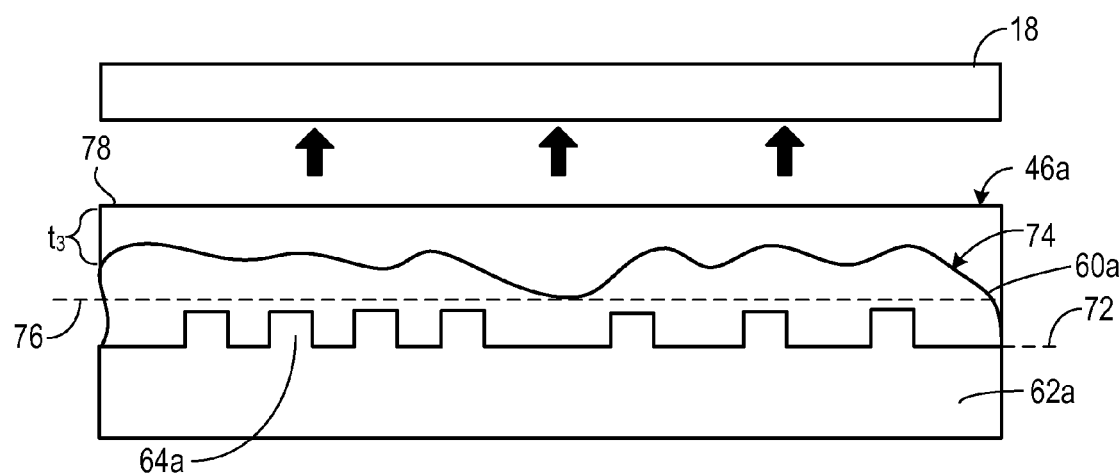
Figure 5D:
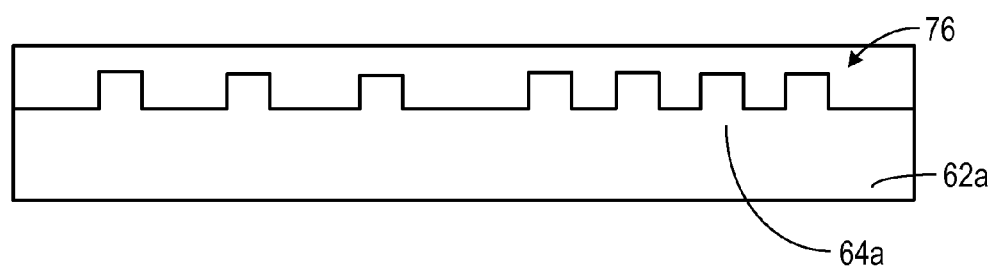

The adaptive nanotopography sculpting process may adapt to varying pattern density on surface 74 using lithographic system 10 shown in FIG. 1 and described herein. Referring to FIG. 5B, polymerizable material 34 may be deposited on first surface 74 of film layer 60a (e.g., SiO$_2$). Polymerizable material 34 may be positioned upon first surface 74 using drop dispense as described herein such that variable amounts of polymerizable material 34 may be positioned at specific location on first surface 74.

Generally, distance between template 18 and first surface 74 is varied to define a desired volume therebetween that may be filled by polymerizable material 34. Template 18 may include mold 20 having a substantially flat patterning surface 22. A force may be applied to template 18 such that template 18 contacts polymerizable material 34 inducing polymerizable material 34 to form a substantially contiguous film and substantially fill the desired volume. Further, spreading of polymerizable material 34 may be governed by capillary forces to form a thin film. After the desired volume is filled with polymerizable material 34, polymerizable material 34 may be solidified to define patterned layer 46a having a surface 78 and defined by a thickness $t_3$. Removal processes (e.g., etching, polishing, CMP, and the like) may then be used to transfer the surface of patterned layer 46a to provide second surface 76 with a desired surface topography.

Deposition of material (e.g., polymerizable material 34) on first surface 74 may achieve the desired surface topography for second surface 76. Additionally, the deposition of material may compensate for various parasitic effects in the process (e.g., effects decreasing degree of desired surface topography including, but not limited to, pattern density variation, long-range wafer topography, etching non-uniformity, polishing non-uniformity, CMP non-uniformity, non-uniform material removal rate, volume shrinkage, evaporation, and the like).

Generally, deposition distributes polymerizable material 34 to provide adequate volume at select regions on first surface 74 such that during removal (e.g., etching) the desired surface topography for second surface 76 may be provided. As such, deposition may adapt for varying pattern densities on first surface 74, underlying layers, and/or the like to provide second surface 76 with desired shape characteristics (e.g., substantially similar topography of surface 72 of substrate 62a, planarity, fanciful shapes, and/or other desired shape characteristics). Deposition generally distributes polymerizable material 34 based on topography of first surface 74 as provided in further detail herein. For example, an increased drop volume or an increased quantity of drops of polymerizable material 34 may be dispensed in low-density areas of first surface 74 to compensate for pattern density variation. This pattern density variation may result from varying pattern density of underlying layer 62a and/or features 64a.

Figure 6:
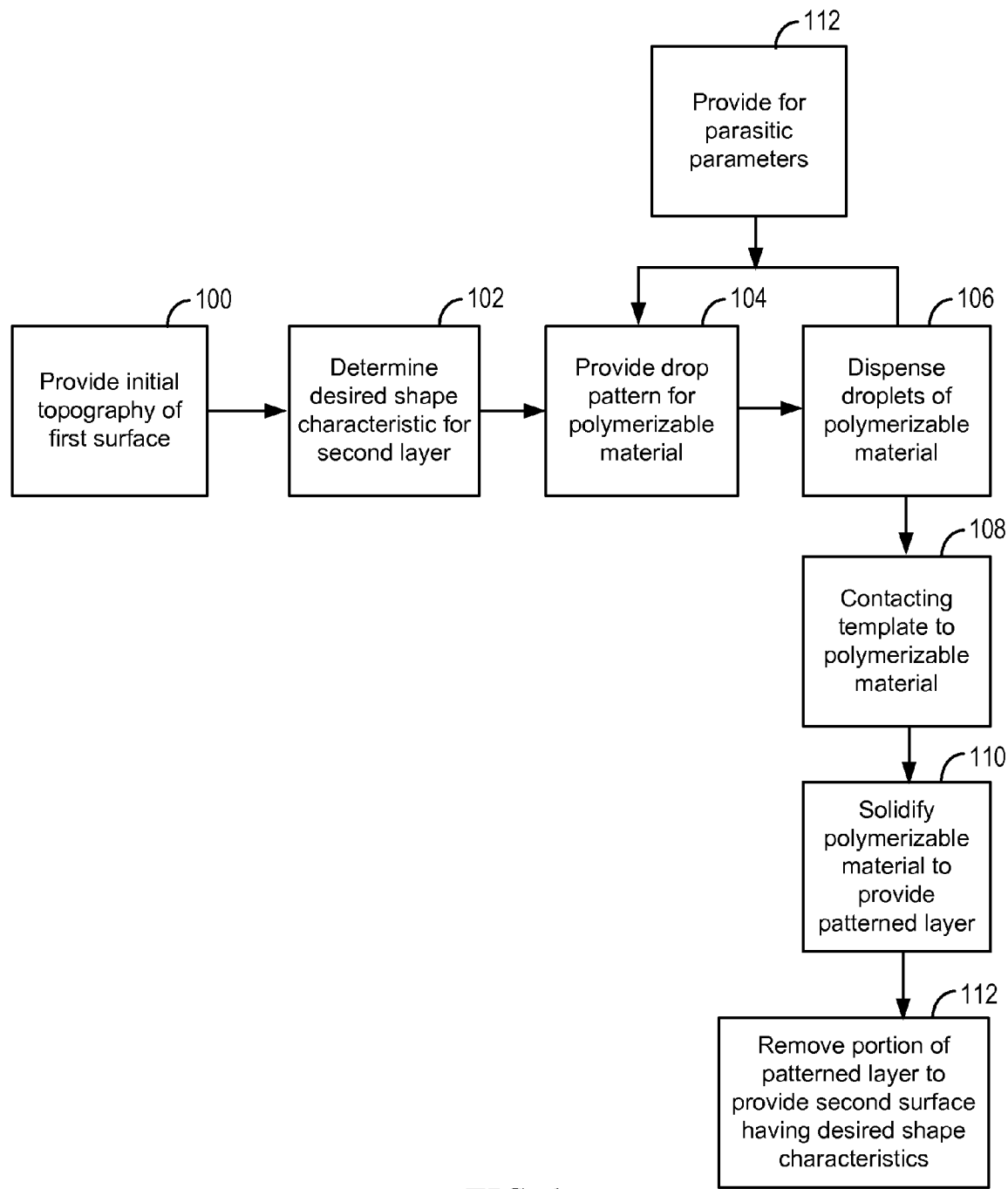
FIG. 6 illustrates a flow chart of one embodiment of a method of forming a surface having desired shape characteristics using adaptive nanotopography sculpting.

Referring to FIG. 6, adaptive nanotopography sculpting may use (a) topography of first surface 74, (b) parameters needed to provide the second surface 76, and (c) spatial distribution parameters to provide a dispense pattern for deposition of polymerizable material 34 on first surface 74. In a step 100, an initial topography map 80 may be provided for first surface 74. In a step 102, parameters to provide second surface 76 having desired surface topography may be determined (e.g., planarization length, thickness, desired final topography). In a step 104, a drop pattern 86 for polymerizable material 34 may be provided based on the initial topography map 80 and parameters of second surface 76. In a step 106, droplets of polymerizable material 34 may be dispensed based on drop pattern 86. In a step 108, template 18 may contact polymerizable material 34. In a step 110, polymerizable material 34 may be solidified to form patterned layer 46a. In a step 112, portions of patterned layer 46a may be removed to provide second surface 76 having desired surface topography.

Figure 7:
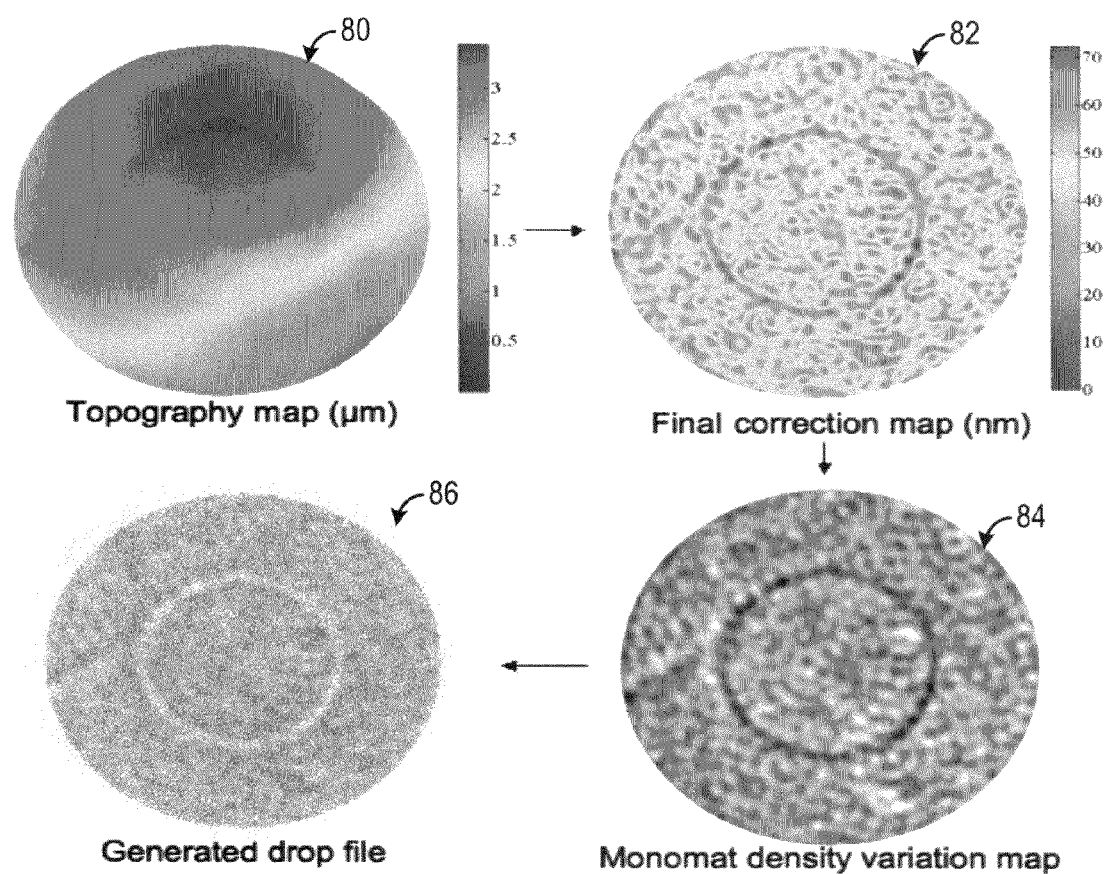
FIG. 7 illustrates a flow chart of one embodiment of a mapping process to provide a drop pattern for use in adaptive nanotopography sculpting.

Referring to FIG. 7, topography map 80 may be provided using a surface scanning system. For example, Zygo[viii] surface scanning system may be used with a sampling grid of 250×250 μm. The difference between topography map 80 provided for first surface 74 and the desired topography for second surface 76 may provide height correction for each location as provided in correction map 82. This information may be further converted to provide feature density map 84. Feature density map 84 may provide the density of polymerizable material 34 needed for each location resulting in drop pattern 86.

Referring to FIGS. 5A-5D, several parameters may be determined and/or balanced to provide control of spatial distribution of polymerizable material 34 including, but not limited to thickness $t_3$ of patterned layer 46a, viscosity of polymerizable material 34, time span between dispensing of polymerizable material 34 and exposure of polymerizable material 34 to energy, stiffness of template 18, and/or the like.

Spatial distribution of polymerizable material 34 may be correlated to spatial distribution of the volume of polymerizable material 34 dispensed. For example, polymerizable material 34 may be dispensed in droplet form to provide a contiguous film yet substantially remain in the location at which the droplet of polymerizable material 34 was dispensed (e.g., minimized lateral movement on surface 74). This correlation may be achieved to provide thickness $t_3$ of about 20 nm to 250 nm. Additionally, viscosity of polymerizable material 34 (e.g., 3 centipoise to 100 centipoise) may provide resistance to lateral free flow of polymerizable material 34.

Spatial distribution may also be correlated with the time span between dispensing of polymerizable material 34 and exposure of polymerizable material 34 to energy (e.g., UV exposure). For example, an adequate time between dispensing of polymerizable material 34 and exposure of polymerizable material 34 to energy may be one that is long enough to allow formation of a contiguous film from droplets of polymerizable material 34, but short enough that significant lateral fluid flow is reduced. An adequate time span may be between a few seconds to a few minutes.

Stiffness of template 18 (e.g., thickness and/or material properties) may also be correlated with spatial distribution of polymerizable material 34. For example, stiffness should be high enough to minimize deformation of individual droplets of polymerizable material 34 to provide for formation of a contiguous film yet low enough to readily conform to the distribution of polymerizable material 34 and low spatial frequency shape of surface 74 of film layer 60*a*. An adequate stiffness may be between 0.25 mm to 2 mm.

Adaptive nanotopography sculpting may also compensate for various parasitic effects 112. Parasitic effects may affect the resulting shape of second surface 76 and may include, but are not limited to, pattern density variations, Ion-range wafer topography, etching non-uniformity, polishing non-uniformity, removal rate of materials, volume shrinkage, evaporation, and the like. For example, drop pattern 86 (shown in FIG. 7) may be determined to compensate for pattern density variation by varying volume of polymerizable material 34 across first surface 74. This variation in volume of polymerizable material 34 may be based on pre-existing pattern density variations and/or estimated pattern density variations.

Additionally, the volume of polymerizable material 34 dispensed on first surface 74 may be determined to provide a desired shape of patterned layer 46*a*. Adjusting the volume to provide the desired shape for patterned layer 46*a* may further provide the nanosculpting of surface topography for second surface 76.

Adaptive nanotopography sculpting may also compensate for the parasitic effect of etching non-uniformity. Generally, polymerizable material 34 may be removed at the same rate as material forming the desired shape of second surface 76. These processes, however, may have non-uniform removal rates based on characteristics of specific removal processes and/or equipment (i.e., etch signature). Non-uniform removal may contribute to degradation of the desired shape characteristic of the second surface 76 (e.g., surface planarity). The etching signature for a particular process and/or equipment may be determined by multiple trials. Once the etching signature is determined, volume of polymerizable material 34 may be adjusted based on the etching signature. For example, drop pattern 86 (shown in FIG. 7) may be adjusted based on the etching signature to compensate for areas having a relatively higher etch rate.

Volume shrinkage of polymerizable material 34 may also be compensated for by using adaptive nanotopography sculpting to provide second surface 76 having desired characteristics (e.g., planarity). As detailed above, polymerizable material 34 solidifies upon exposure to energy. This solidification process may be accompanied by shrinkage in the volume of polymerizable material 34. For example, shrinkage may be from about 5-25% depending on the composition of polymerizable material 34. Shrinkage may depend on local volume that may vary over first surface 74 and may also give rise to stresses in the film of solidified polymerizable material 34. This shrinkage effect may be compensated for by varying distribution of polymerizable material 34 in drop pattern 86. In addition, or in lieu of, stress may be relieved by removal and/or deformation of template 18.

Evaporation is another parasitic effect that may be compensated for by using adaptive nanotopography sculpting. The evaporation rate of polymerizable material 34 may be high depending on composition. For example, there may be a loss of polymerizable material 34 due to evaporation subsequent to depositing of polymerizable material 34 yet prior to imprinting. Evaporation may be generally higher near edges of first surface 74.

The expected volume loss due to evaporation may also be determined and compensated for in drop pattern 86 to provide second surface 76 having desired characteristics (e.g., planarity). For example, the airflow maintained for controlling humidity, temperature, particle accumulation, and the like may contribute to non-uniform evaporation. This airflow may result in systematic non-uniform evaporation. An evaporation signature may be determined and compensated for by adjusting drop pattern 86 to provide second surface 76 having desired shape characteristics (e.g., planarity).

Adaptive nanotopography sculpting may also compensate for variations of polymerizable material 34. For example, a first polymerizable material and a second polymerizable material may be dispensed on first surface 74 with the first polymerizable material being different from the second polymerizable material. The first polymerizable material may have a different removal rate (e.g., etch rate) than the second polymerizable material. As such, drop pattern 86 may be adjusted to provide for a first volume of the first polymerizable material to be deposited and a second volume of the second polymerizable material to be deposited to minimize effects of differing removal rates.

Adaptive nanotopography sculpting may be used in lieu of physical polishing in applications such as substrate polishing, polishing of pre-patterned substrates, polishing of non-flat surfaces, and non-flat nanotopography applications and other processes as further described below. For example, adaptive nanotopography sculpting may be used in lieu of substrate polishing, such as, for example, in planarization of the nominal surface of bare silicon substrates. In the removal step, the material to be etched using adaptive nanotopography sculpting may be a bulk substrate material including, but not limited to, silicon, $SiO_2$, GaAs, InP, Sapphire, and/or the like.

Figure 8:
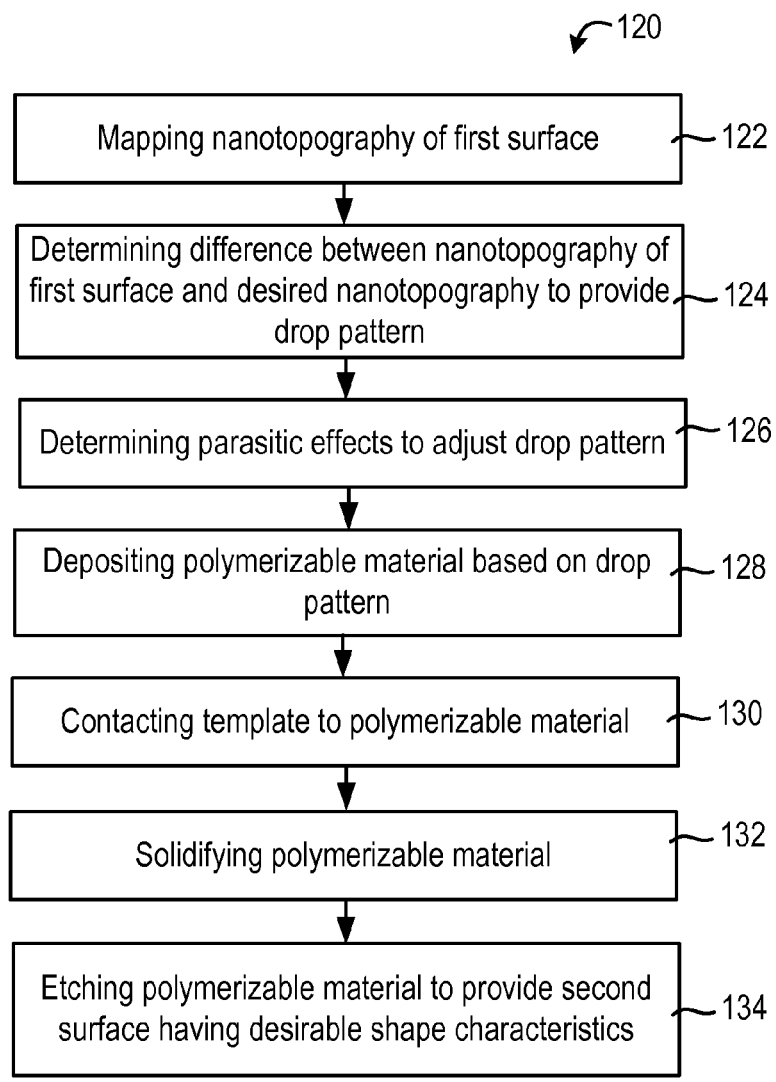
FIG. 8 illustrates a flow chart of one embodiment of a method for pre-polishing a surface of a substrate.

FIG. 8 illustrates a method 120 using adaptive nanotopography sculpting in lieu of polishing of pre-patterned substrates, such as, for example, in patterned layer applications to provide a planarized surface. Generally, drop pattern 86 may be adjusted to generate additional compensation for patterned features based on pattern layout. For example, dispensing of polymerizable material 34 on first surface 74 may include volume variations from pre-exiting pattern.

In a step 122, nanotopography of a surface may be mapped. For example, nanotopography of first surface 74 may be mapped using a Zygo instrument, profilometer, or the like. In a step 124, the difference between first surface 74 and the desired final nanotopography (e.g., second surface 76) may be determined to provide drop pattern 86. In a step 126, parasitic effects may be determined to adjust drop pattern 86. In a step 128, drop pattern 86 may be used to deposit polymerizable material 34 on first surface 74 to provide a second surface 76 having desired shape characteristics. In a step 130, template 17 may be placed in contact with polymerizable material 34. In a step 132, polymerizable material 34 may be solidified using imprint lithography template 18. In a step 134, solidified polymerizable material may be etched to provide second surface 76 having desirable shape characteristics.

In patterned substrate applications, the presence of patterns in etchable materials (e.g., $SiO_2$) may provide a 1:1 etch back step to transfer the desired shape characteristics to form second surface 76. If patterns are present in materials that are not readily etchable (e.g., copper), adaptive nanotopography sculpting may still be used with another material removal process (e.g., chemical mechanical polishing) to provide desired shape characteristics of second surface 76, in addition to or in lieu of etching.

Figure 9:
FIG. 9 illustrates a simplified side view of a surface having non-flat desired shape characteristics.

Referring to FIG. 9, adaptive nanotopography sculpting may be used to create a non-flat desired shape characteristic for second surface 76. For example, second surface 76 may have a concave shape, convex shape, spherical shape, aspherical shape, continuous periodic shape, or any other fanciful shape. Generally, an additional alteration (e.g., adjustment of algorithm) in determination of drop pattern 86 (as illustrated in FIG. 7) may provide for variations in second surface 76. For example, second surface 76 as illustrated in FIG. 9 may have a spherical convex shape with a large radius of curvature where h may be in a range of 10 nm to 10 microns and w may be in the range of 1 mm to 1000 mm.

Figure 10A:
FIGS. 10A-10C illustrate simplified side views of formation of a surface having a non-flat desired shape characteristic.
Figure 10B:
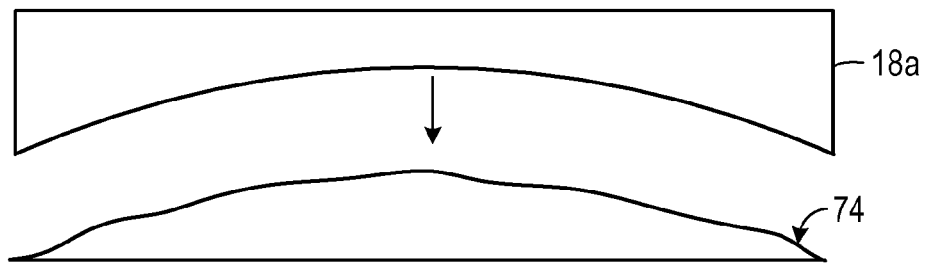
Figure 10C:
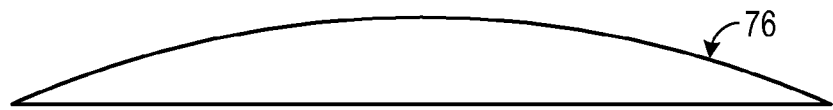

Adaptive nanotopography sculpting may also address nanotopography of any free-form surface (i.e., non-planar surfaces). For example, nominal shape (i.e., height variation in the spatial wavelength >20 mm) may be affected by bulk manufacturing processes (e.g., casting, machining, grinding, and the like), but is generally not affected during polishing. Polishing processes may have the ability to conform to the nominal shape. Conventional polishing processes generally do not affect the nominal shape but may affect nanotopography due to pattern density variation. Also, conventional polishing tools may require a significant change in machine design to accommodate a change in nominal shape of a substrate (e.g., machine design for CMP of a flat surface may be extremely different from a machine for CMP of a spherical surface). As such, conventional polishing tools may only address spherical/aspherical/symmetric shapes. Adaptive nanotopography sculpting, however, may address alteration of nanotopography of a free-form surface such as, for example, the free-form surface (e.g., first surface 74) illustrated in FIGS. 10A-10C. As illustrated in these FIGS., an imprint lithography template 18a, having a complementary shape of free-form first surface 74 may be used to provide an alteration of the nanotopography of second surface 76 as compared to first surface 74.

In adaptive nanotopography sculpting of a spherical/aspherical lens, the lens doublet may be machined down. For example, the lens doublet may be machined down to about 500 microns thickness. This spherical and/or flexible piece of material may be used as imprint lithography template 18a. For other free-form shapes, a PDMS template may be made using casting of the desired complementary shape.

Additionally, or in lieu of complementary shaped template 18a (e.g., template 18), a pressurized cavity chuck may be used to control the radius of the nominal shape of template 18a. This process may be used, for example, in polishing of spherical/aspherical surfaces having specific nominal shapes as defined by the design of the chuck and/or geometry of template 18a.

Alternatively, template 18a may be designed having a minimized thickness made of non-brittle material. Template 18 may be optionally bonded to a thicker fused silica frame to provide additional strength. Generally, the fused silica frame may provide an adapter between chuck and template 18.

What is claimed is:

1. A method of forming a surface having desired shape characteristic using an imprint lithography system, comprising:
    determining nanotopography of a first surface;
    determining desired shape characteristic for a second surface;
    evaluating the nanotopography of the first surface and the desired shape characteristic for the second surface to provide a drop pattern;
    depositing polymerizable material between a template and the first surface according to the drop pattern;
    contacting the template to the polymerizable material;
    solidifying the polymerizable material;
    etching the polymerizable material to provide the second surface having the desirable shape characteristic.

2. The method of claim 1, further comprising determining at least one parasitic effect and adjusting the drop pattern to compensate for the parasitic effect.

3. The method of claim 2, wherein the parasitic effect is evaporation of the polymerizable material.

4. The method of claim 2, wherein the parasitic effect is variation in pattern density.

5. The method of claim 2, wherein the parasitic effect is etching non-uniformity.

6. The method of claim 2, wherein the parasitic effect is polishing non-uniformity.

7. The method of claim 2, wherein the parasitic effect is volume shrinkage.

8. The method of claim 1, wherein etching the polymerizable material alters the nanotopography and roughness of the first surface.

9. The method of claim 1, wherein the desired shape characteristic of the second surface is planar.

10. The method of claim 1, wherein the desired shape characteristic of the second surface is non-planar.

11. The method of claim 1, wherein depositing polymerizable material between a template and the first surface according to the drop pattern further comprises:
    depositing a first polymerizable material having a first etch rate and depositing a second polymerizable material having a second etch rate; and,
    adjusting the drop pattern to compensate for the first etch rate and the second etch rate.

12. The method of claim 11, wherein the first etch rate and the second etch rate are different.

13. The method of claim 1, wherein evaluating the nanotopography of the first surface and the desired shape characteristic for the second surface to provide the drop pattern further comprises:
    evaluating the differences between the nanotopography of the first surface and the desired shape characteristic for the second surface to provide a height correction map;
    providing a density map based on the height correction map; and,
    using the density map to determine the drop pattern.

14. A method of forming a surface having desired nanotopography using an imprint lithography system, comprising:
    determining nanotopography of a surface;
    evaluating the nanotopography of the surface to determine height correction between the nanotopography of the surface as compared to a desired nanotopography;
    providing a density map based on the height correction between the nanotopography of the surface as compared to the desired nanotopography;
    determining a drop pattern based on the density map;

depositing polymerizable material between an imprint lithography template and the surface according to the drop pattern;
contacting the template to the polymerizable material;
solidifying the polymerizable material;
etching the polymerizable material to provide the surface with the desired nanotopography.

15. The method of claim 14, further comprising determining at least one parasitic effect and adjusting the drop pattern to compensate for the parasitic effect.

16. The method of claim 14, wherein the desired nanotopography is planar.

17. The method of claim 14, wherein the surface is non-planar and etching the polymerizable material provides the surface with planar topography while maintaining the nominal non-planar surface.

18. A method of forming a planar surface using an imprint lithography system, comprising:
    determining nanotopography of a surface;
    evaluating the nanotopography of the surface to determine a drop pattern to provide the planar surface for a first polymerizable material having a first etch rate and a second polymerizable material having a second etch rate;
    depositing the first polymerizable material and the second polymerizable material between an imprint lithography template and the surface according to the drop pattern;
    contacting the template to at least one of the first polymerizable material and the second polymerizable material;
    solidifying at least one of the first polymerizable material and the second polymerizable material;
    etching at least one of the first polymerizable material and the second polymerizable material to provide the planar surface.

19. The method of claim 18, further comprising determining at least one parasitic effect and adjusting the drop pattern to compensate for the parasitic effect.

20. The method of claim 18, wherein evaluating the nanotopography of the surface to determine a drop pattern further comprises:
    evaluating the nanotopography of the surface to determine height correction between the nanotopography of the surface as compared to the planar surface to be formed;
    providing a density map based on the height correction; and,
    determining the drop pattern based on the density map.

* * * * *